(12) United States Patent
Yen

(10) Patent No.: US 12,143,701 B2
(45) Date of Patent: Nov. 12, 2024

(54) IMAGE CAPTURING MODULE AND MANUFACTURING METHOD THEREOF

(71) Applicant: GUANGZHOU LUXVISIONS INNOVATION TECHNOLOGY LIMITED, Guangzhou (CN)

(72) Inventor: Shih-Chieh Yen, Guangzhou (CN)

(73) Assignee: GUANGZHOU LUXVISIONS INNOVATION TECHNOLOGY LIMITED, Guangzhou (CN)

( * ) Notice: Subject to any disclaimer, the term of this patent is extended or adjusted under 35 U.S.C. 154(b) by 507 days.

(21) Appl. No.: 17/493,857

(22) Filed: Oct. 5, 2021

(65) Prior Publication Data
US 2022/0124231 A1 Apr. 21, 2022

(30) Foreign Application Priority Data
Oct. 21, 2020 (CN) .......................... 202011130979.6

(51) Int. Cl.
*H04N 23/55* (2023.01)
*G02B 7/02* (2021.01)
*H01L 27/146* (2006.01)

(52) U.S. Cl.
CPC ............. *H04N 23/55* (2023.01); *G02B 7/025* (2013.01); *H01L 27/14627* (2013.01); *H01L 27/14643* (2013.01); *H01L 27/14683* (2013.01)

(58) Field of Classification Search
CPC ......... H01L 27/14627; H01L 27/14643; H01L 27/14645; H01L 27/1464; H01L 27/14685; H01L 27/14818; H01L 27/14831; H01L 27/14875; H04N 23/55; G02B 7/025
See application file for complete search history.

(56) References Cited

U.S. PATENT DOCUMENTS

2009/0153707 A1* 6/2009 Nakao .................... H04N 23/55
348/294

FOREIGN PATENT DOCUMENTS

CN  102263116 B  * 11/2014  ....... H01L 27/14618

* cited by examiner

*Primary Examiner* — Brook Kebede
(74) *Attorney, Agent, or Firm* — JCIPRNET

(57) ABSTRACT

An image capturing module including an image capturing unit, a lens set and a first adhesive layer is provided. The lens set is disposed on the image capturing unit. The lens set has a light incident surface and a light emitting surface opposite to each other and has at least one side surface, the light emitting surface faces the image capturing unit, and the side surface is connected between the light incident surface and the light emitting surface. The first adhesive layer covers the side surface of the lens set. In addition, a manufacturing method of the image capturing module is also provided.

18 Claims, 5 Drawing Sheets

IMAGE CAPTURING MODULE AND MANUFACTURING METHOD THEREOF

CROSS-REFERENCE TO RELATED APPLICATION

This application claims the priority benefit of China application serial no. 202011130979.6, filed on Oct. 21, 2020. The entirety of the above-mentioned patent application is hereby incorporated by reference herein and made a part of this specification.

BACKGROUND

Technical Field

The disclosure relates to an optical module and a manufacturing method thereof, and in particular, to an image capturing module and a manufacturing method thereof.

Description of Related Art

Most consumer electronic products, such as laptop computers, tablet computers, and smartphones, are equipped with an image capturing unit. The image capturing unit is generally located at a screen frame area, so a size of the image capturing unit has to be reduced to adapt to the current trend of electronic products with a narrow frame design. However, a housing is adopted to support and assemble a lens set of the image capturing unit. The size of the image capturing unit is increased because of the housing surrounding the lens set. On the other hand, some image capturing units are manufactured through a wafer-level process. Although an optical sensing chip and a lens set can be directly combined without using the housing to support and assemble the lens set, a side surface of the lens set thus is not covered, which leads to light leakage and affects the image quality.

SUMMARY

The disclosure is directed to an image capturing module and a manufacturing method thereof which may reduce a size of an image capturing module and avoid light leakage of the image capturing module.

The image capturing module of the disclosure includes an image capturing unit, a lens set, and a first adhesive layer. The lens set is disposed on the image capturing unit. The lens set has a light incident surface and a light emitting surface opposite to each other and has at least one side surface. The light emitting surface faces the image capturing unit, and the side surface is connected between the light incident surface and the light emitting surface. The first adhesive layer covers the side surface of the lens set.

In an embodiment of the disclosure, the image capturing module further includes a second adhesive layer. The second adhesive layer is disposed on the light incident surface or disposed between the light emitting surface and the image capturing unit.

In an embodiment of the disclosure, the second adhesive layer includes at least three sub-adhesive layers laminated sequentially.

In an embodiment of the disclosure, an interface is present between the any two adjacent sub-adhesive layers.

In an embodiment of the disclosure, an aspect ratio of the second adhesive layer is not less than 0.5 and is not greater than 3.

In an embodiment of the disclosure, the height of the second adhesive layer is between 50 μm and 200 μm, and the width of the second adhesive layer is between 70 μm and 200 μm.

In an embodiment of the disclosure, the image capturing unit has an active area and a non-active area. The second adhesive layer is formed through an inkjet printing process and is overlapped with the non-active area in a direction perpendicular to the light incident surface.

In an embodiment of the disclosure, the second adhesive layer is a continuous ring-shaped adhesive layer and is disposed between the light emitting surface and the image capturing unit. A closed space is formed between the image capturing unit, the continuous ring-shaped adhesive layer, and the lens set.

In an embodiment of the disclosure, the image capturing unit has an active area and a non-active area. The non-active area surrounds the active area. The second adhesive layer includes multiple segments. The segments are overlapped with the non-active area in the direction perpendicular to the light incident surface.

In an embodiment of the disclosure, the image capturing module further includes a filter. The filter is disposed on the light incident surface through adhesion of the second adhesive layer or is disposed between the image capturing unit and the lens set through adhesion of the second adhesive layer.

The manufacturing method of the image capturing module of the disclosure includes the following steps. A lens set is disposed on an image capturing unit. The lens set has a light incident surface and a light emitting surface opposite to each other and has at least one side surface. The light emitting surface faces the image capturing unit, and the at least one side surface is connected between the light incident surface and the light emitting surface. A first adhesive layer is formed on the at least one side surface of the lens set.

In an embodiment of the disclosure, the manufacturing method includes the following steps. A second adhesive layer is disposed on the light incident surface or disposed between the light emitting surface and the image capturing unit.

In an embodiment of the disclosure, forming the second adhesive layer includes forming at least three sub-adhesive layers laminated sequentially.

In an embodiment of the disclosure, forming the sub-adhesive layers includes causing an interface to be present between any two adjacent sub-adhesive layers.

In an embodiment of the disclosure, an aspect ratio of the second adhesive layer is not less than 0.5 and is not greater than 3.

In an embodiment of the disclosure, the height of the second adhesive layer is between 50 μm and 200 μm, and the width of the second adhesive layer is between 70 μm and 200 μm.

In an embodiment of the disclosure, the image capturing unit has an active area and a non-active area. Forming the second adhesive layer includes forming the second adhesive layer through an inkjet printing process and causing the second adhesive layer to be overlapped with the non-active area in a direction perpendicular to the light incident surface.

In an embodiment of the disclosure, forming the second adhesive layer includes forming the second adhesive layer as a continuous ring-shaped adhesive layer between the light emitting surface and the image capturing unit to form a closed space between the image capturing unit, the continuous ring-shaped adhesive layer, and the lens set.

In an embodiment of the disclosure, the image capturing unit has an active area and a non-active area. The non-active area surrounds the active area. Forming the second adhesive layer includes forming multiple segments. The segments are overlapped with the non-active area in the direction perpendicular to the light incident surface.

In an embodiment of the disclosure, the manufacturing method further includes disposing a filter on the light incident surface through adhesion of the second adhesive layer or disposing the filter between the image capturing unit and the lens set through adhesion of the second adhesive layer.

Based on the above, in the image capturing module of the disclosure, the lens set is disposed on the image capturing unit, and the side surface of the lens set is covered by the first adhesive layer. Accordingly, it is not necessary to use a housing to support and assemble the lens set. Furthermore, the first adhesive layer covering the side surface of the lens set can avoid light leakage from the side surface of the lens set during light transmission in the lens set. Therefore, the size of the image capturing module may be reduced without disposing a housing to support and assemble the lens set, and an image quality is increased since the lens set is not subject to light leakage.

DESCRIPTION OF THE EMBODIMENTS

Figure 1:
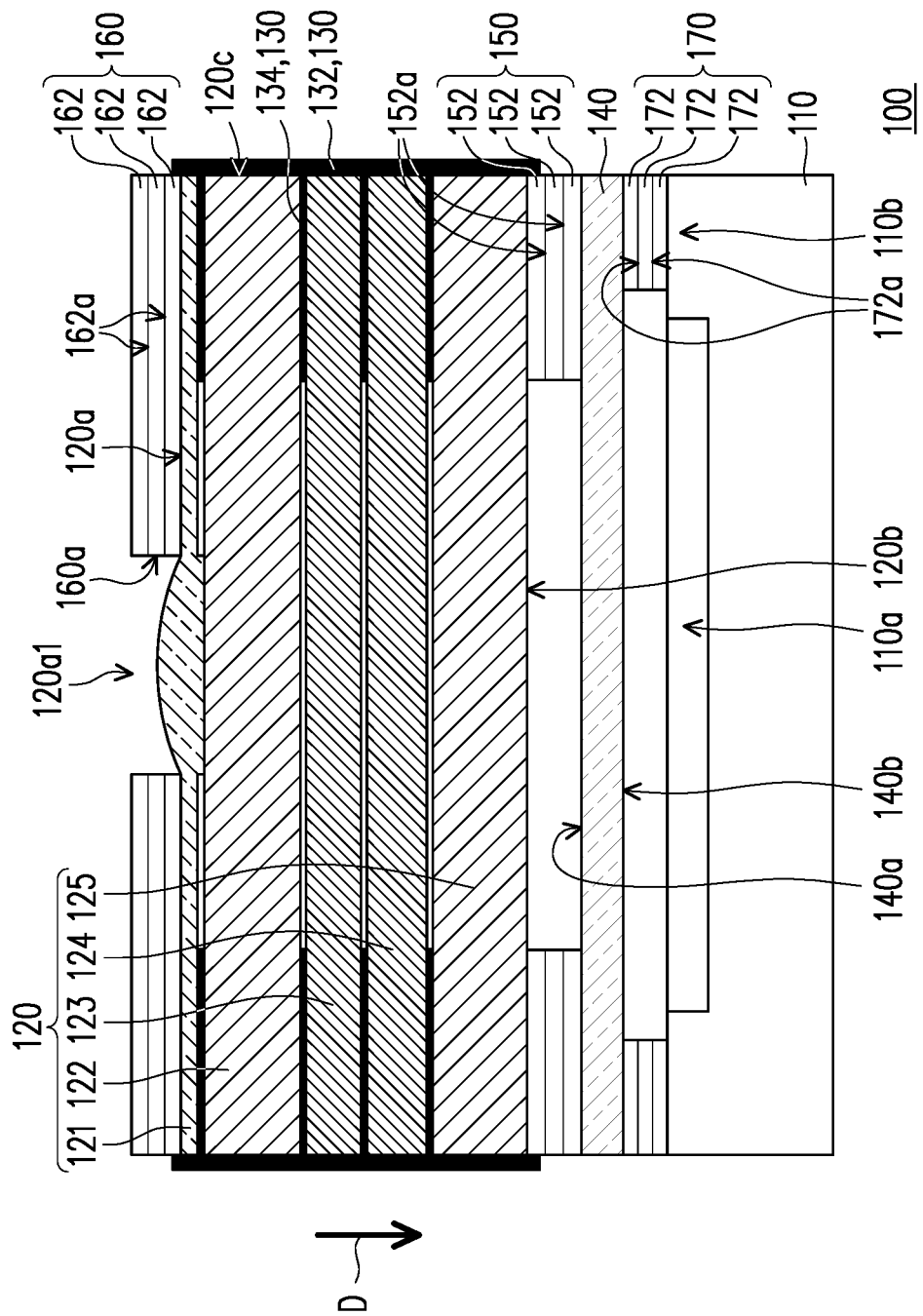
FIG. 1 is a schematic cross-sectional diagram of an image capturing module according to an embodiment of the disclosure.

FIG. 1 is a schematic cross-sectional diagram of an image capturing module according to an embodiment of the disclosure. Referring to FIG. 1, an image capturing module 100 of the embodiment includes an image capturing unit 110 and a lens set 120. The lens set 120 includes multiple lenses 121~125 mutually stacked and disposed on the image capturing unit 110. In other embodiments, the lens set 120 may include different numbers or shapes of lenses, and the disclosure provides no limitation thereto. The lens set 120 has a light incident surface 120a and a light emitting surface 120b opposite to each other and has at least one side surface 120c. The light emitting surface 120b faces the image capturing unit 110, and each side surface 120c is connected between the light incident surface 120a and the light emitting surface 120b. A light may enter the lens set 120 from the light incident surface 120a and is transmitted to the light emitting surface 120b in the lens set 120 to be transmitted toward the image capturing unit 110 from the light emitting surface 120b. The image capturing unit 110 may include a complementary metal-oxide-semiconductor (CMOS) device or other types of light sensing devices. The image capturing unit 110 has an active area 110a and a non-active area 110b surrounding the active area 110a. The active area 110a may sense the light to capture a corresponding image.

The lens set 120 of the embodiment may be, for example, manufactured through a wafer-level process and disposed on the image capturing unit 110 as described above. Therefore, it is not necessary to use a housing to support and assemble the lens set 120. In addition, the image capturing module 100 of the embodiment further includes a first adhesive layer 130. A material of the first adhesive layer 130 is, for example, an opaque adhesive material such as resin. The first adhesive layer 130 covers the side surface 120c of the lens set 120 to avoid light leakage from the side surface 120c of the lens set 120 during light transmission in the lens set 120. Therefore, a size of the image capturing module 100 may be reduced without disposing a housing to support and assemble the lens set 120, and an image quality is increased since the lens set 120 is not subject to light leakage.

Since a size of the image capturing unit 110 of the embodiment may be reduced as described above, it is favorable for a narrow frame design when the image capturing unit 110 is arranged on a screen frame of an electronic product such as a laptop computer, a tablet computer, or a smartphone.

In the embodiment, the image capturing module 100 further includes a filter 140 and two second adhesive layers 150 and 170. A material of the second adhesive layers 150 and 170 is, for example, an opaque adhesive material such as resin. The filter 140 is disposed between the image capturing unit 110 and the lens set 120 through adhesion of the second adhesive layers 150 and 170. Specifically, the filter 140 has a first surface 140a and a second surface 140b opposite to each other. The second adhesive layer 150 is adhered between the light emitting surface 120b of the lens set 120 and the first surface 140a of the filter 140, and extends along the periphery of the light emitting surface 120b of the lens set 120 and the periphery of the first surface 140a of the filter 140. The second adhesive layer 170 is adhered between the second surface 140b of the filter 140 and the image capturing unit 110, and extends along the periphery of the second surface 140b of the filter 140. Accordingly, the second adhesive layer 170 is overlapped with the non-active area 110b of the image capturing unit 110 in a direction D perpendicular to the light incident surface 120a, and surrounds the active area 110a of the image capturing unit 110. Light leakage may be avoid though light blocking of the second adhesive layers 150 and 170 to maintain the good image quality.

Furthermore, the first adhesive layer 130 of the embodiment includes a covering part 132 and multiple extending parts 134 connected to each other. The covering part 132 covers the side surface 120c of the lens set 120. The extending parts 134 of the first adhesive layer 130 extend from the side surface 120c to positions between the two adjacent lenses 121 and 122, the two adjacent lenses 122 and 123, the two adjacent lenses 123 and 124, and the two adjacent lenses 124 and 125 to stably fix the lenses 121~125. The extending parts 134 of the first adhesive layer 130 as shown in FIG. 1 extend along the periphery of a surface of each of the lenses 121~125, so that they do not block light transmission from the light incident surface 120a toward the light emitting surface 120b. In the embodiment, the first adhesive layer 130 may be formed through an inkjet printing process (e.g. a 3D printing process) or other suitable manners. The disclosure is not limited thereto.

In addition, the image capturing module 100 further includes another second adhesive layer 160. A material of the second adhesive layer 160 is, for example, an opaque adhesive material such as resin. The second adhesive layer 160 is disposed on the light incident surface 120*a* of the lens set 120 and has a first opening 160*a*. The first opening 160*a* is aligned with a light incident area 120*a*1 of the light incident surface 120*a*, so that the light may pass through the first opening 160*a* of the second adhesive layer 160 and be transmitted toward the lens set 120.

Furthermore, the second adhesive layers 150, 160, and 170 of the embodiment are all printed layer by layer from bottom to up through the inkjet printing process (e.g. the 3D printing process). Therefore, the second adhesive layer 150 includes at least three sub-adhesive layers 152 laminated sequentially, the second adhesive layer 160 includes at least three sub-adhesive layers 162 laminated sequentially, and the second adhesive layer 170 includes at least three sub-adhesive layers 172 laminated sequentially. An interface 152*a* is present between any two adjacent sub-adhesive layers 152, an interface 162*a* is present between any two adjacent sub-adhesive layers 162, and an interface 172*a* is present between any two adjacent sub-adhesive layers 172.

In the embodiment, an aspect ratio of any of the second adhesive layers 150, 160, and 170 is, for example, not less than 0.5 and not greater than 3. The height of any of the second adhesive layers 150, 160, and 170 is, for example, between 50 μm and 200 μm, and the width of any of the second adhesive layers 150, 160, and 170 is, for example, between 70 μm and 200 μm. In other embodiments, the second adhesive layers 150, 160, and 170 may have other suitable sizes, and the disclosure is not limited thereto.

Figure 2:
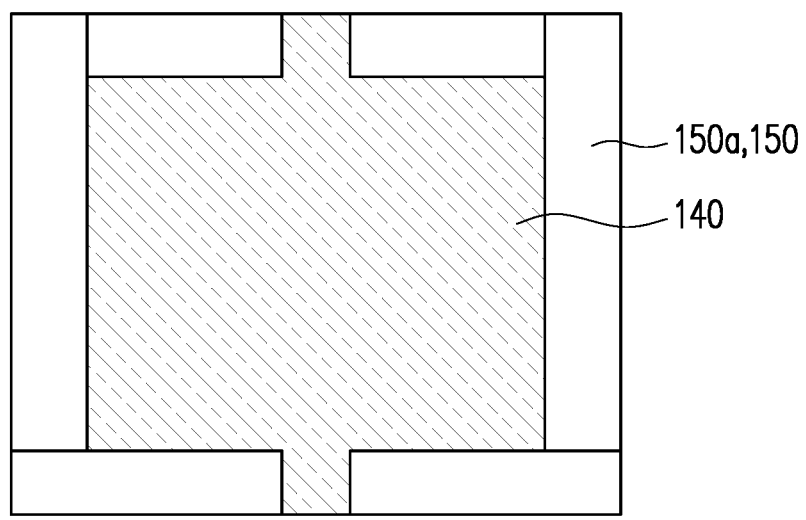
FIG. 2 is a top view of a partial structure of the image capturing module in FIG. 1.

FIG. 2 is a top view of a partial structure of the image capturing module in FIG. 1. Referring to FIG. 2, the second adhesive layer 150 of the embodiment includes multiple segments 150*a*. The segments 150*a* are overlapped with the non-active area 110*b* of the image capturing unit 110 in the direction D (as shown in FIG. 1) perpendicular to the light incident surface 120*a*. The way the second adhesive layer 170 extends may be similar to the way the second adhesive layer 150 extends. The second adhesive layers 150 and 170 may also be continuous ring-shaped adhesive layers, and the disclosure is not limited thereto.

Figure 3:
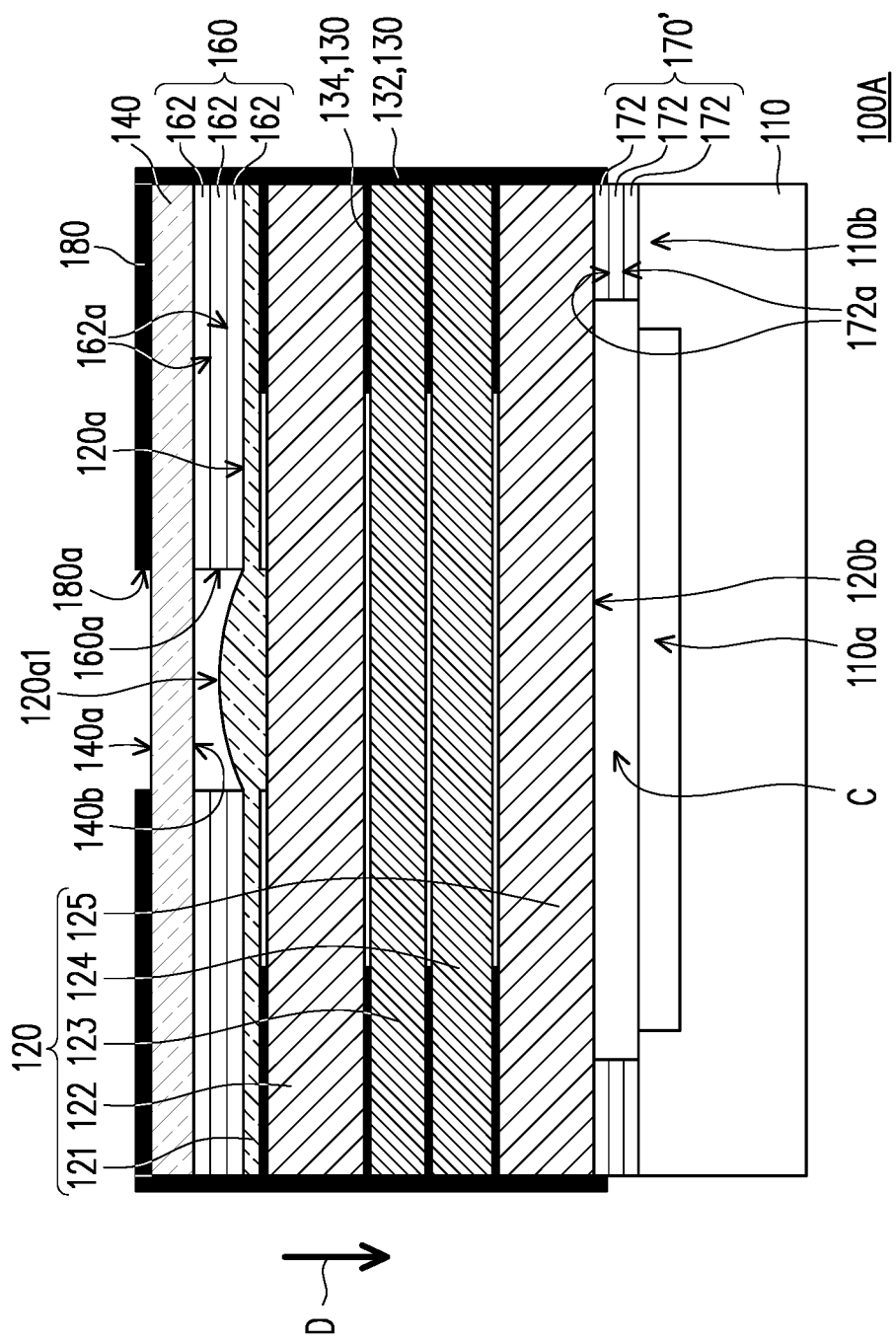
FIG. 3 is a schematic cross-sectional diagram of an image capturing module according to another embodiment of the disclosure.

FIG. 3 is a schematic cross-sectional diagram of an image capturing module according to another embodiment of the disclosure. The difference between an image capturing module 100A as shown in FIG. 3 and the image capturing module 100 as shown in FIG. 1 is that the filter 140 of the image capturing module 100A is not disposed between the image capturing unit 110 and the lens set 120. The filter 140 of the image capturing module 100A is disposed on the light incident surface 120*a* of the lens set 120 through adhesion of the second adhesive layer 160. Therefore, the image capturing unit 110 and the lens set 120 are directly adhered to each other, and the image capturing module 100A omits the second adhesive layer 150 shown in FIG. 1. In addition, the image capturing module 100A further includes a light blocking layer 180. The light blocking layer 180 is disposed on the first surface 140*a* of the filter 140. The light blocking layer 180 has a second opening 180*a*. Both of the first opening 160*a* of the second adhesive layer 160 and the second opening 180*a* of the light blocking layer 180 correspond to the light incident area 120*a*1 of the light incident surface 120*a*, so that the light may pass through the first opening 160*a* of the second adhesive layer 160 and the second opening 180*a* of the light blocking layer 180 and be transmitted toward the lens set 120.

Figure 4:
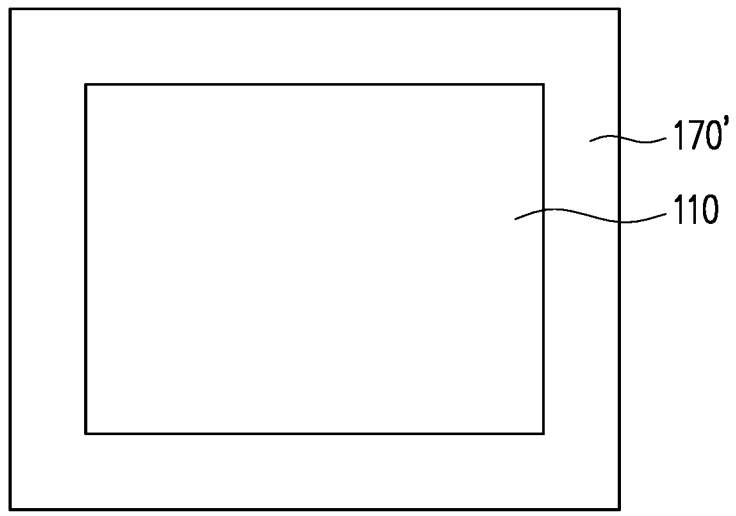
FIG. 4 is a top view of a partial structure of the image capturing module in FIG. 3.
Figure 5:
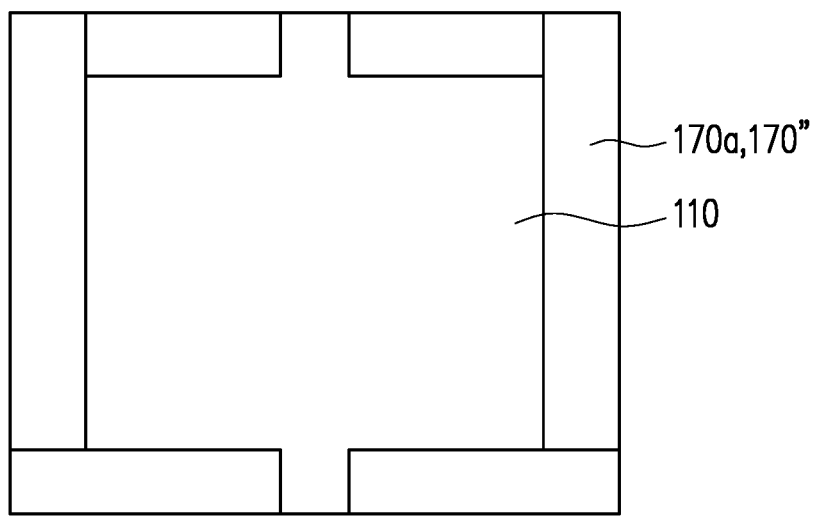
FIG. 5 is a top view of a partial structure of an image capturing module according to another embodiment of the disclosure.

FIG. 4 is a top view of a partial structure of the image capturing module in FIG. 3. A second adhesive layer 170' of the embodiment is adhered between the light emitting surface 120*b* of the lens set 120 and the image capturing unit 110. The second adhesive layer 170' as shown in FIG. 4 is a continuous ring-shaped adhesive layer, so that the closed space C is formed between the image capturing unit 110, the continuous ring-shaped adhesive layer (the second adhesive layer 170'), and the lens set 120 to avoid light leakage through light blocking of the second adhesive layer 170' to maintain the good image quality. FIG. 5 is a top view of a partial structure of the image capturing module according to another embodiment of the disclosure. The difference between the embodiment shown in FIG. 5 and the embodiment shown in FIG. 4 is that the second adhesive layer 170" in FIG. 5 includes multiple segments 170*a*. The segments 170*a* are overlapped with the non-active area 110*b* (as shown in FIG. 3) of the image capturing unit 110 in the direction D (as shown in FIG. 3) perpendicular to the light incident surface 120*a*.

Figure 6:
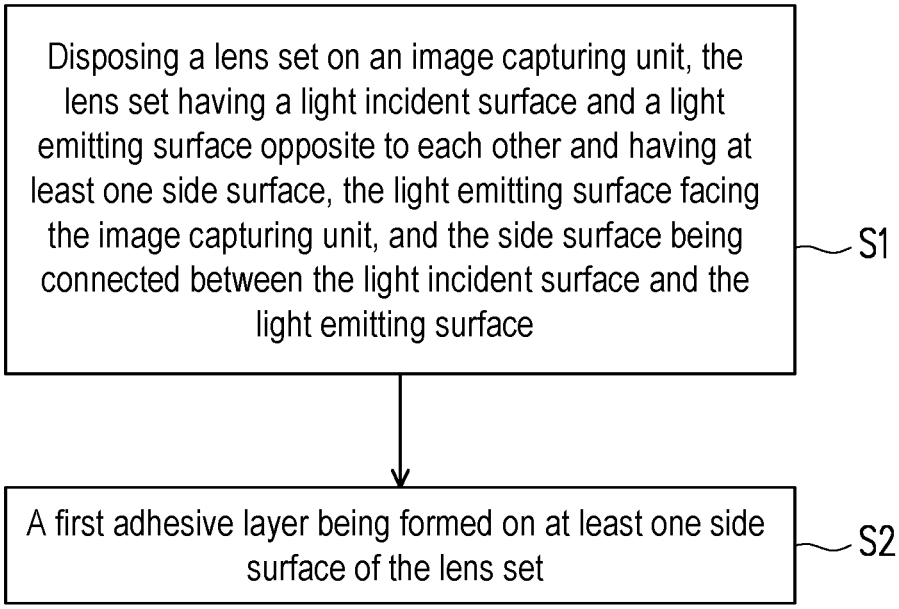
FIG. 6 is a flow chart of a manufacturing method of an image capturing module according to an embodiment of the disclosure.

The image capturing module of the embodiments above is taken as an example below to describe a manufacturing method of the image capturing module of an embodiment of the disclosure. FIG. 6 is a flow chart of a manufacturing method of an image capturing module according to an embodiment of the disclosure. Referring to FIG. 6, first, the lens set 120 is disposed on the image capturing unit 110. The lens set 120 has the light incident surface 120*a* and the light emitting surface 120*b* opposite to each other and has at least one side surface 120*c*. The light emitting surface 120*b* faces the image capturing unit 110, and the side surface 120*c* is connected between the light incident surface 120*a* and the light emitting surface 120*b* (step S1). Next, the first adhesive layer 130 is formed on the side surface 120*c* of the lens set 120 (step S2).

In the manufacturing method above, the second adhesive layers 150, 160, and 170 as shown in FIG. 1 may be further formed through the inkjet printing process (e.g. the 3D printing process). The second adhesive layer 160 is disposed on the light incident surface 120*a*, and the second adhesive layers 150 and 170 are disposed between the light emitting surface 120*b* and the image capturing unit 110. The second adhesive layers 150 and 170 are overlapped with the non-active area 110*b* in the direction D perpendicular to the light incident surface 120*a*. Accordingly, the filter 140 may be disposed between the image capturing unit 110 and the lens set 120 through adhesion of the second adhesive layers 150 and 170. Or, the second adhesive layers 160 and 170' as shown in FIG. 3 may be formed through the inkjet printing process. The second adhesive layer 160 is disposed on the light incident surface 120*a*, and the second adhesive layer 170' is disposed between the light emitting surface 120*b* and the image capturing unit 110. The second adhesive layer 170' is overlapped with the non-active area 110*b* in the direction D perpendicular to the light incident surface 120*a*. Accordingly, the filter 140 may be disposed on the light incident surface 120*a* through adhesion of the second adhesive layer 160.

Furthermore, in the process of forming the second adhesive layer 150, at least three sub-adhesive layers 152 laminated sequentially are formed to cause an interface 152*a* to be present between any two adjacent sub-adhesive layers 152. Similarly, in the process of forming the second adhesive layer 160, at least three sub-adhesive layers 162 laminated sequentially are formed to cause an interface 162*a* to be present between any two adjacent sub-adhesive layers 162, and in the process of forming the second adhesive layer 170 (170'), at least three sub-adhesive layers 172 laminated sequentially are formed to cause an interface 172*a* to be present between any two adjacent sub-adhesive layers 172. In the process of forming the multiple sub-adhesive layers as described above, first, for example, a sub-adhesive layer is printed. After the sub-adhesive layer is precured, another sub-adhesive layer is printed on it. The process repeats until a desired height of an adhesive layer is formed. Then, the overall adhesive layer is completely cured. Since the adjacent sub-adhesive layers are sequentially precured, an interface may form therebetween as described above.

In the process of forming the second adhesive layer, the second adhesive layer 150 may be formed to include the multiple segments 150a as shown in FIG. 2. The segments 150a are overlapped with the non-active area 110b in the direction D perpendicular to the light incident surface 120a. In addition, in the process of forming the second adhesive layer, the second adhesive layer 170' may be formed as a continuous ring-shaped adhesive layer as shown in FIG. 4 to form the closed space C between the image capturing unit 110, the continuous ring-shaped adhesive layer (the second adhesive layer 170'), and the lens set 120. Or, a second adhesive layer 170" may be formed to include the multiple segments 170a as shown in FIG. 5. The segments 170a are overlapped with the non-active area 110b in the direction D perpendicular to the light incident surface 120a. The disclosure does not intend to limit the printing methods of the second adhesive layer. The second adhesive layer may be a continuous ring-shaped adhesive layer or include multiple segments, and have a suitable shape and a suitable extending range.

In summary of the above, in the image capturing module of the disclosure, the lens set is disposed on the image capturing unit, and the side surface of the lens set is covered by the first adhesive layer. Accordingly, it is not necessary to use a housing to support and assemble the lens set. Furthermore, the first adhesive layer covering the side surface of the lens set can avoid light leakage from the side surface of the lens set during light transmission in the lens set. Therefore, a size of the image capturing module may be reduced without disposing a housing to support and assemble the lens set, and an image quality is increased since the lens set is not subject to light leakage. Furthermore, the first adhesive layer may include the extending part extending to a position between the two adjacent lenses to stably fix the lenses. In addition, the second adhesive layer configured to adhere the image capturing unit, the lens set, and the filter together may be laminated layer by layer through the inkjet printing process. Therefore, the second adhesive layer with a desired size is accurately formed.

What is claimed is:

1. An image capturing module, comprising:
an image capturing unit;
a lens set disposed on the image capturing unit, wherein the lens set has a light incident surface and a light emitting surface opposite to each other and has at least one side surface, the light emitting surface faces the image capturing unit, and the at least one side surface is connected between the light incident surface and the light emitting surface;
a first adhesive layer covering the at least one side surface of the lens set; and
a second adhesive layer, disposed on the light incident surface or disposed between the light emitting surface and the image capturing unit.

2. The image capturing module according to claim 1, wherein the second adhesive layer comprises at least three sub-adhesive layers laminated sequentially.

3. The image capturing module according to claim 2, wherein an interface is present between the any two adjacent sub-adhesive layers.

4. The image capturing module according to claim 1, wherein an aspect ratio of the second adhesive layer is not less than 0.5 and is not greater than 3.

5. The image capturing module according to claim 1, wherein a height of the second adhesive layer is between 50 µm and 200 µm, and a width of the second adhesive layer is between 70 µm and 200 µm.

6. The image capturing module according to claim 1, wherein the image capturing unit has an active area and a non-active area, and the second adhesive layer is formed through an inkjet printing process and is overlapped with the non-active area in a direction perpendicular to the light incident surface.

7. The image capturing module according to claim 1, wherein the second adhesive layer is a continuous ring-shaped adhesive layer and is disposed between the light emitting surface and the image capturing unit, and a closed space is formed between the image capturing unit, the continuous ring-shaped adhesive layer, and the lens set.

8. The image capturing module according to claim 1, wherein the image capturing unit has an active area and a non-active area, the non-active area surrounds the active area, the second adhesive layer comprises a plurality of segments, and the plurality of segments are overlapped with the non-active area in a direction perpendicular to the light incident surface.

9. The image capturing module according to claim 1, further comprising a filter, wherein the filter is disposed on the light incident surface through adhesion of the second adhesive layer or is disposed between the image capturing unit and the lens set through adhesion of the second adhesive layer.

10. A manufacturing method of an image capturing module, comprising:
disposing a lens set on the image capturing unit, wherein the lens set has a light incident surface and a light emitting surface opposite to each other and has at least one side surface, the light emitting surface faces the image capturing unit, and the at least one side surface is connected between the light incident surface and the light emitting surface;
forming a first adhesive layer on the at least one side surface of the lens set; and
disposing a second adhesive layer on the light incident surface or disposing the second adhesive layer between the light emitting surface and the image capturing unit.

11. The manufacturing method of the image capturing module according to claim 10, wherein forming the second adhesive layer comprises:
forming at least three sub-adhesive layers laminated sequentially.

12. The manufacturing method of the image capturing module according to claim 11, wherein forming the sub-adhesive layers comprises:
causing an interface to be present between the any two adjacent sub-adhesive layers.

13. The manufacturing method of the image capturing module according to claim 10, wherein an aspect ratio of the second adhesive layer is not less than 0.5 and is not greater than 3.

14. The manufacturing method of the image capturing module according to claim 10, wherein a height of the second adhesive layer is between 50 μm and 200 μm, and a width of the second adhesive layer is between 70 μm and 200 μm.

15. The manufacturing method of the image capturing module according to claim 10, wherein the image capturing unit has an active area and a non-active area, and forming the second adhesive layer comprises:
   forming the second adhesive layer through an inkjet printing process and causing the second adhesive layer to be overlapped with the non-active area in a direction perpendicular to the light incident surface.

16. The manufacturing method of the image capturing module according to claim 10, wherein forming the second adhesive layer comprises:
   forming the second adhesive layer as a continuous ring-shaped adhesive layer between the light emitting surface and the image capturing unit to form a closed space between the image capturing unit, the continuous ring-shaped adhesive layer, and the lens set.

17. The manufacturing method of the image capturing module according to claim 10, wherein the image capturing unit has an active area and a non-active area, the non-active area surrounds the active area, and forming the second adhesive layer comprises:
   forming a plurality of segments, wherein the segments are overlapped with the non-active area in a direction perpendicular to the light incident surface.

18. The manufacturing method of the image capturing module according to claim 10, further comprising:
   disposing the filter on the light incident surface through adhesion of the second adhesive layer or disposing the filter between the image capturing unit and the lens set through adhesion of the second adhesive layer.

* * * * *